United States Patent
Tuladhar

(10) Patent No.: US 7,071,759 B2
(45) Date of Patent: Jul. 4, 2006

(54) METHOD FOR DETERMINING RMS VALUES FOR GRID-LINKED CONVERTERS

(75) Inventor: Anil Tuladhar, Dearborn Heights, MI (US)

(73) Assignee: Ballard Power Systems Corporation, Dearborn, MI (US)

(*) Notice: Subject to any disclaimer, the term of this patent is extended or adjusted under 35 U.S.C. 154(b) by 280 days.

(21) Appl. No.: 10/797,905

(22) Filed: Mar. 9, 2004

(65) Prior Publication Data

US 2004/0249876 A1    Dec. 9, 2004

Related U.S. Application Data

(60) Provisional application No. 60/469,073, filed on May 7, 2003, provisional application No. 60/470,543, filed on May 9, 2003.

(51) Int. Cl.
*G06F 7/556* (2006.01)
*H02M 3/335* (2006.01)
*G05F 5/00* (2006.01)

(52) U.S. Cl. ............................. 327/348; 363/15

(58) Field of Classification Search ................. 363/15, 363/16, 50, 55, 95, 131; 323/299, 301, 303; 327/346–349; 324/76.38, 76.39, 76.42, 120
See application file for complete search history.

(56) References Cited

U.S. PATENT DOCUMENTS

| | | | | |
|---|---|---|---|---|
| 4,274,143 A * | 6/1981 | Brodie et al. | ............... | 702/198 |
| 5,896,056 A * | 4/1999 | Glucina | ..................... | 327/348 |
| 6,411,072 B1 * | 6/2002 | Feldman | ..................... | 323/299 |
| 6,765,516 B1 * | 7/2004 | Coley et al. | ............... | 341/126 |
| 6,794,881 B1 * | 9/2004 | Reichel et al. | .............. | 324/522 |

OTHER PUBLICATIONS

U.S. Appl. No. 60/469,073, filed May 7, 2003, Tuladhar.
U.S. Appl. No. 60/470,543, filed May 9, 2003, Tuladhar.

* cited by examiner

*Primary Examiner*—Matthew V. Nguyen
(74) *Attorney, Agent, or Firm*—Seed IP Law Group PLLC

(57) ABSTRACT

Techniques for determining root mean square (RMS) values of a signal for controlling operation of grid-linked converters, such as DC-to-AC inverters, via squaring the signal, sampling the squared signal n times during a cycle period to obtain n samples, summing the first n−1 samples to obtain a first value, multiplying the first value by a sampling time and a frequency of the signal to obtain a second value, determining a compensation factor, adding the compensation factor to the second value to obtain a third value, and determining a square root of the third value to obtain a RMS result.

30 Claims, 6 Drawing Sheets

US 7,071,759 B2

METHOD FOR DETERMINING RMS VALUES FOR GRID-LINKED CONVERTERS

BACKGROUND OF THE INVENTION

1. Field of the Invention

The present disclosure relates generally to power circuits, and in particular but not exclusively, to techniques for determining root mean square (RMS) values, such as RMS current or voltage, for a grid-linked converter.

2. Description of the Related Art

Existing techniques to calculate root mean square (RMS) values for voltage or current can provide very inaccurate results if the sampling rate is not an integral multiple of the frequency of the sampled signal. Also, existing RMS calculation techniques use components that are complex, inflexible, and expensive.

BRIEF SUMMARY OF THE INVENTION

In one aspect, a method of determining a root mean square (RMS) of a signal for controlling operation of a converter includes squaring the signal, sampling the squared signal n times during a cycle period to obtain n samples, summing the first n−1 samples to obtain a first value, multiplying the first value by a sampling time and a frequency of the signal to obtain a second value, determining a compensation factor, adding the compensation factor to the second value to obtain a third value, and determining a square root of the third value to obtain a RMS result.

In another aspect, a processor-readable medium includes instructions for causing a processor to determine a RMS of a signal by sampling the signal n times during a cycle period to obtain n samples, squaring the first n−1 samples to obtain n−1 squared samples, summing the n−1 squared samples to obtain a first value, multiplying the first value by a sampling time and a frequency of the signal to obtain a second value, determining a compensation factor, adding the compensation factor to the second value to obtain a third value, and determining a square root of the third value to obtain a RMS result.

In a further aspect, an electric power system to transform power between a power grid and a power source includes a converter; at least one switch selectively operable to electrically couple the converter to the power grid in a first state and to electrically uncouple the converter from the power grid in a second state; and a controller coupled to control the converter and the at least one switch, the controller configured to determine a root mean square (RMS) of a signal associated with the power grid by squaring the signal, sampling the squared signal n times during a cycle period to obtain n samples, summing the first n−1 samples to obtain a first value, multiplying the first value by a sampling time and a frequency of the signal to obtain a second value, determining a compensation factor, adding the compensation factor to the second value to obtain a third value, and determining a square root of the third value to obtain a RMS result.

BRIEF DESCRIPTION OF THE SEVERAL VIEWS OF THE DRAWING(S)

In the drawings, identical reference numbers identify similar elements or acts. The sizes and relative position of elements in the drawings are not necessarily drawn to scale. For example, the shapes of various elements and angles are not drawn to scale, and some of these elements are arbitrarily enlarged and/or positioned to improve drawing legibility. Further, the particular shapes of the elements as drawn, are not intended to convey any information regarding the actual shape of the particular elements, and have solely been selected for ease of recognition in the drawings.

Non-limiting and non-exhaustive embodiments are described with reference to the following figures.

DETAILED DESCRIPTION OF THE INVENTION

Embodiments of techniques to determine root mean square (RMS) values of voltage and/or current for grid-linked inverters are described herein. In the following description, certain specific details are set forth in order to provide a thorough understanding of the various embodiments of the present techniques. However, one skilled in the art will understand that the present techniques may be practiced without these details. In other instances, well-known structures associated with inverters, converters, rectifiers, and processors or controllers have not been shown or described in detail to avoid unnecessarily obscuring descriptions of the embodiments of the present techniques.

Unless the context requires otherwise, throughout the specification and claims which follow, the word "comprise" and variations thereof, such as, "comprises" and "comprising" are to be construed in an open, inclusive sense, that is as "including, but not limited to."

The headings provided herein are for convenience only and do not interpret the scope or meaning of the claimed invention.

Reference throughout this specification to "one embodiment" or "an embodiment" means that a particular feature, structure, or characteristic described in connection with the embodiment is included in at least one embodiment of the present techniques. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As an overview, an embodiment of the present techniques provides a software solution (as opposed to a hardware solution) to determine RMS values for grid-linked inverters. A more-accurate RMS determination is obtained within a wide range of frequency variations, and is flexible and is less sensitive to noise and other disturbances.

Figure 1:
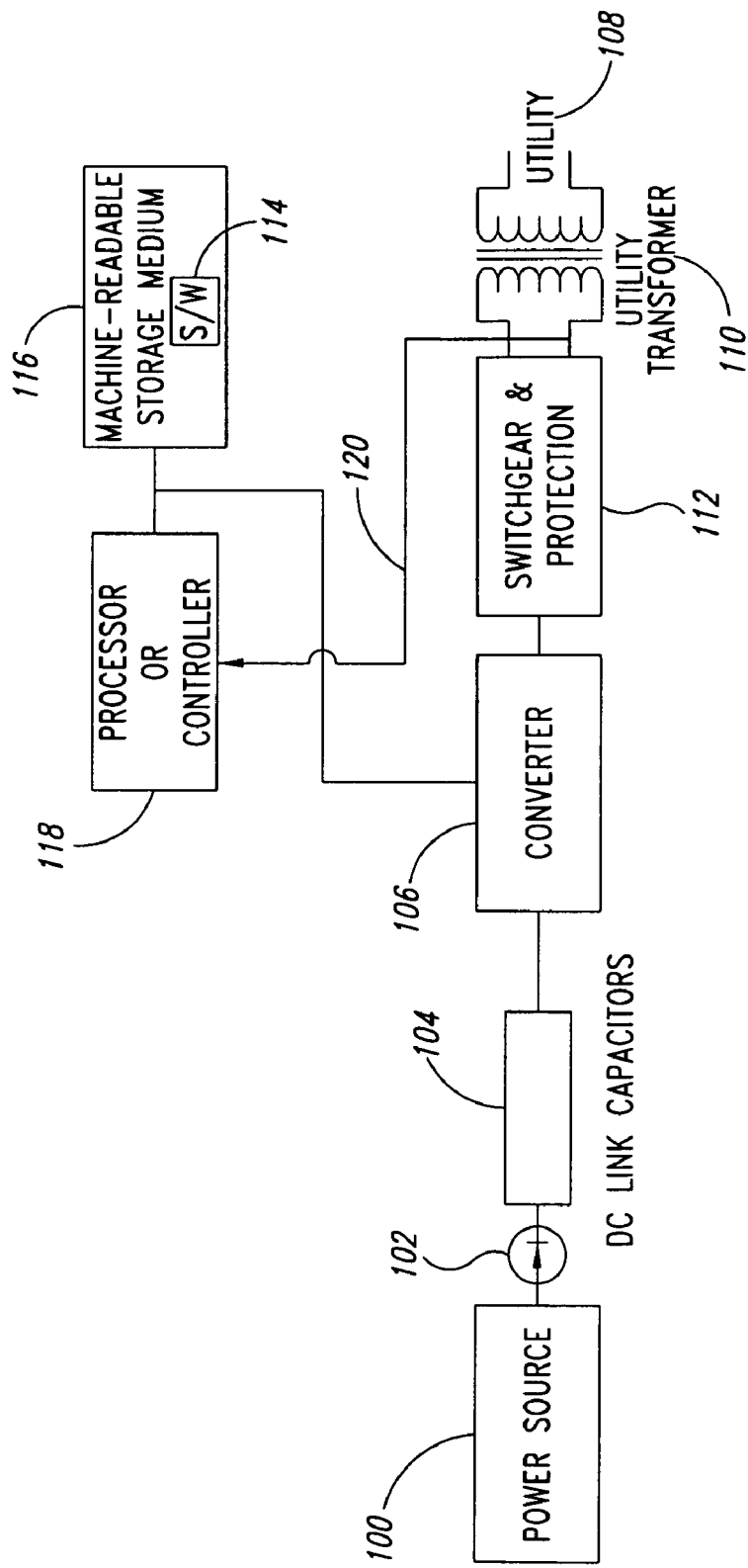
FIG. 1 is a block diagram of a system in which an embodiment of the present techniques may be implemented.

FIG. 1 is a block diagram of a system in which an embodiment of the present techniques may be implemented. A power source 100 can comprise a photovoltaic array, fuel cell system, micro-turbine, flywheel, or other source of direct current (DC) or alternating current (AC) power. The power from the power source 100 is provided, by way of one or more diode(s) 102 and DC link capacitor(s) 104, to a converter 106. Generally, the converter 106 may take the form of an inverter, a rectifier, a step-up converter, or a step-down converter. In particular, the converter 106 may take the form of a voltage source inverter operating in current control mode in one embodiment, and inverts the extracted power into AC power. The converter 106 exports the AC power to a utility power grid 108, by way of utility transformer(s) 110 and switchgear 112. Protection components, such as protection relays, may sometimes be present to protect the converter 106 from abnormal voltage or current conditions at the power grid 108. While the switchgear and protection components are depicted collectively in a separate block 112 in FIG. 1, it will be appreciated by those skilled in the art that some of these components may be integrated with components of the converter 106.

Power grid voltages often need to be determined accurately in order to protect the converter 106. The converter 106 or a protection component should be able to detect any over or under voltage condition of any one or more phases of the power grid 108 in a predefined time period. In order to meet these requirements, the RMS value of the voltage of each phase needs to be determined separately and accurately.

The challenges to accurately determining the RMS values of the individual phases include the limited sampling rate, the variable power grid frequency, the fact that the sampling rate (which is used in the RMS determination) is at times not an integral multiple of the power grid frequency, and the absence of zero-crossing detection schemes. These factors make the RMS determination very inaccurate.

Some RMS determination schemes employ hardware RMS calculators or use zero-crossing detectors. However, neither of these options are optimal. For instance, hardware RMS calculators or zero-crossing detectors are expensive and inflexible. Both also produce a ripple effect in the output if the frequency of the signal being sampled changes significantly.

As will be described in further detail below, one embodiment of the present techniques provides a software solution for determining RMS values. Such software 114 or other machine-readable instruction that embody an RMS determination algorithm can be stored on a machine-readable storage medium 116. Examples of the machine-readable storage medium 116 include, but are not limited to, random access memory (RAM), read-only memory (ROM), cache, hard disk, portable data storage devices (such as CD-ROM or diskette), and/or other suitable storage media. A processor or controller 118 is communicatively coupled to the storage medium 116 to allow the controller 118 to execute the software 114 stored thereon.

The storage medium 116 can store, in addition to the software 114, sample data, results of calculations, and other relevant information. In addition to executing the software 114, the controller 118 can also initiate and control data and command transfers to, and from, the sampling components or other components depicted in FIG. 1, and can also initiate protective measures if the RMS determinations indicate abnormal conditions. In one embodiment, the controller 118 and storage medium 116 can be communicatively coupled to the converter 106, although it is appreciated that the controller 118 and/or storage medium 116 may also be communicatively coupled to any other suitable component, such as to the switchgear and protection block 112. Thus, if the determined RMS values indicate an abnormal current or voltage condition, the controller 118 can initiate protective measures, such as opening contacts or switches, tripping relays, and the like.

The accuracy and speed of RMS voltage or current determination plays a major role in the protection of the converter 106. Protection relays are available which can detect and protect a converter from abnormal voltage or current conditions, but such are very expensive. There are also standard algorithms for the calculation of RMS values. However, those algorithms give accurate results only if the frequency remains constant and/or the sampling rate is very high. In real world applications, it is not practical to have a very high sampling rate for the voltage and current sensing. With a low sampling rate, an accurate RMS measurement can be guaranteed only if the sampling rate is made to be an integral multiple of the fundamental frequency and if the signal frequency remains constant.

However, in practical situations, the power grid frequency does not remain constant. The power grid frequency is typically allowed to drop down as low as 59.3 Hz and to increase up to 60.5 Hz. In some developing countries, the variations can be as high as a few Hertz. The existing low-sampling-rate RMS calculation methods fail to calculate the RMS without ripples. The error in the calculation could be a few percent when the frequency changes.

The present techniques account for these problems and compensate for the RMS error by using the frequency information of the signal. Since RMS is not an instantaneous phenomenon, it is possible to have a very high accuracy in RMS determination when the frequency information is used as a feedback for the RMS determination.

One embodiment of the present techniques estimates the error in an RMS determination every half cycle using the frequency information. In existing systems, the RMS calculation is complicated by the fact that the sampling rate is not a multiple of the fundamental frequency. A basic RMS calculation introduces a significant ripple in its result. Analysis of the problem and solution are discussed below.

One existing method of finding the RMS value comprises:
Obtain samples of the signal for a cycle;
Square the samples and sum them up;
Find the mean square by dividing the integral (sum) by the number of samples per cycle; and
Find the square root of the mean square.

This method implicitly assumes that the sampling rate is an integral multiple of the fundamental frequency of the signal. Thus, the existing method requires the same number of points per cycle. If the sampling time is Ts and the period of the signal is T, then T/Ts will give the number of samples (n) per cycle.

From the definition of RMS:

$$\begin{aligned} RMS1 &= \text{square root of (area under } v^2 \text{ curve}/T) \\ &= \text{square root } (v_1^2 * Ts + v_2^2 * Ts + \ldots + v_n^2 * Ts)/T \\ &= \text{square root (sum } (v^2) * Ts/T) \\ &= \text{square root (sum } (v^2)/n) \end{aligned}$$

When T is not an integral multiple of Ts, the samples in each cycle will not be identical to the samples from the previous cycle. Consequently, there will be a slow rotation of the sampled values, which introduces a beat pattern in the RMS value. Besides the variation in sample values in a given cycle, some cycles could potentially miss one entire sample. If the sampling rate is low, for example 2 kHz, missing one sample can cause an error of almost 3%.

Another problem associated with the existing method is that the RMS value is sensitive to the location where samples are started in the cycle. If a sampling system always starts taking the data at the zero crossing of the cycle, then the RMS value is always underestimated. If the sampling is started at a 90-degree point, the RMS value will be overestimated. In a three-phase system, if the sampling is started for all three phases simultaneously, then a sampling starting at a zero crossing for phase A would necessarily not be a zero crossing for the phases B and C. Thus, the existing approach requires detection of the zero crossing of each phase separately and a start of calculation from there. While not impossible, this requirement substantially complicates the algorithm, and results in substantial added costs.

As mentioned above, there is not always a guarantee that the power grid frequency will be at exactly at 60 Hz. It can vary from 59.3 to 60.5 Hz, for example. So making the sampling rate an integral multiple of the signal frequency is not a practical solution to the problem.

According to the present techniques, an improved approach to RMS determination is obtained from the definition of RMS. More specifically, in accordance with one embodiment, the following approach is taken:

$$\begin{aligned} RMS2 &= \text{square root (area under } v^2 \text{ curve for a cycle}/T) \\ &= \text{square root } (((v_1^2 * Ts + v_2^2 * Ts + \ldots + \\ &\quad v_{n-1}^2 * Ts) + v_n^2 * (T - (n-1) * Ts))/T) \\ &= \text{square root (Frequency} * (\text{sum } (v_{n-1}^2 * Ts) + \\ &\quad v_n^2 (1 - \text{Frequency} * (n-1) * Ts) \end{aligned}$$

The above RMS2 equation ensures that the approximate area under the curve (i.e., voltage squared) is determined with a proper cycle period. This approach enhances accuracy. The sampling time Ts and power grid frequency are known. The first term (i.e., Frequency*(sum($v^2_{n-1}$)*Ts)) represents sample values up to the n−1 sample, while the second term (i.e., $v^2_n$(1−Frequency*(n−1)*Ts)) represents a compensation factor. Since the frequency of the power grid is used in this equation, a multiplication can be performed, in contrast to using a division operation in the prior RMS1 equation, which would require more computational effort.

Figure 2:
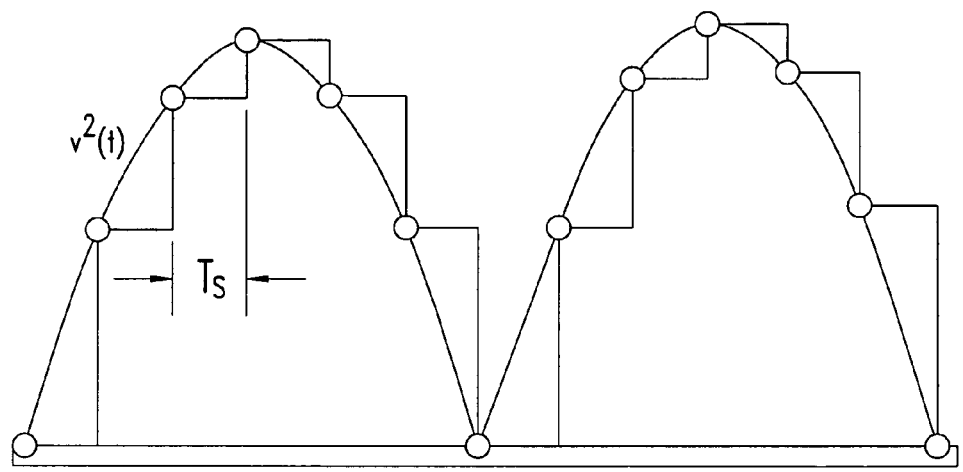
FIG. 2 is a graph of sampled squared voltage versus actual squared voltage illustrating an example situation where the sampling frequency is an integral multiple of the signal frequency.
Figure 3:
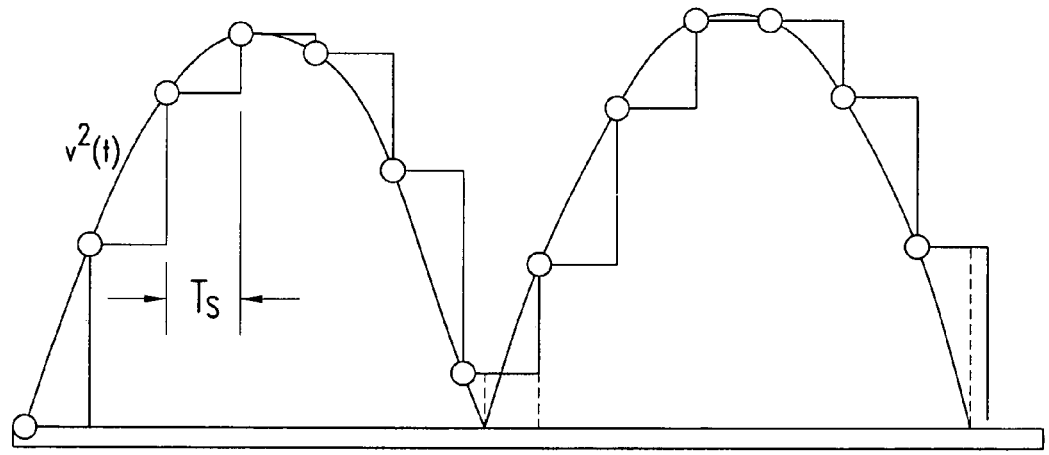
FIG. 3 is a graph of sampled squared voltage versus actual squared voltage illustrating an example situation where the sampling frequency is not an integral multiple of the signal frequency, and further illustrates example area results determined in accordance with an embodiment of the present techniques.

The implications of the various sampling techniques are illustrated in FIGS. 2 and 3. FIG. 2 is a graph illustrating an exemplary situation where the sampling frequency is an integer multiple of the signal frequency. Hence, the sample-per-cycle is fixed and sample values are similar in each cycle.

In contrast, FIG. 3 is a graph illustrating an exemplary situation where the sampling frequency is a non-integer multiple of the signal frequency. With conventional methods, the calculated RMS value will be overestimated for the second half cycle. FIG. 3 clearly shows that the number of points in the second half-cycle is not equal to the first half cycle, and therefore the RMS value calculated using the conventional method will not yield good results.

The broken lines in FIG. 3 show the area that would be determined in accordance with the present techniques that employ the RMS2 equation. The areas under the curve up to the next-to-the-last sample in each half cycle are summed, and then a compensation factor is added to complete the area approximation. As can be seen, the area under the curve is equal in the two half cycles.

Some possible advantages of the present RMS determination techniques may include:

1. Avoidance a division operation, hence the technique may be less computationally intensive than the existing techniques.

2. Compensation for the area error, leading to more accurate results.

3. Allowance for half cycle data to be used for the RMS determination, speeding up the RMS determination and reducing memory requirements and computational efforts.

4. Insensitivity to the starting point of samples in the cycle, requiring no zero-cross detection.

5. Works over a broad range of frequencies.

In one embodiment of the present techniques, determinations using the RMS2 equation can be performed by the software 114 and controller 118. The software and controller may employ a look-up table to obtain approximate results for the square root operation or may rely on analytical or numerical computation. A look-up table has the advantage of being fast and not computationally intensive. However, a look-up table has a certain amount of relative error, since the value of which the square root will be taken is often not a perfect square, and therefore, the controller has to select the closest available value for the square root from the look-up table. The amount of relative inaccuracy is thus mainly dependent on the resolution of the look-up table.

Figure 4A:
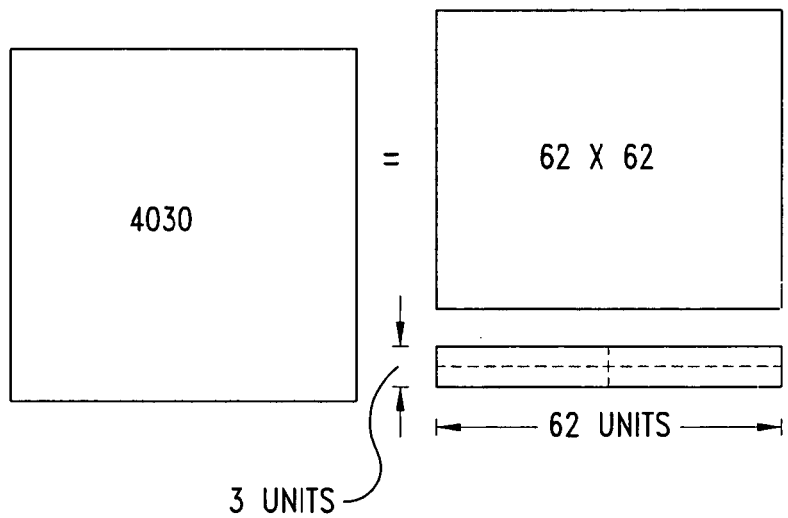
FIGS. 4A–4C are diagrams illustrating an example technique for determining a square root.

In an alternate embodiment of the present techniques, the issue of determining a square root of a value that is not a perfect square is addressed based on the concept of geometric approximation of a squared number, and is described below with reference to FIGS. 4A–4C.

Consider a number (e.g., 4030), which is not a perfect square. This number may, for example, be the result of equation RMS2, prior to performing the square root operation. The value 4030 can be thought of as representing the area of a rectangle of sides 62×65. A square of size 62×62 is cut from this rectangle, resulting in a remainder piece of size 3×62=186 square units.

Figure 4B:
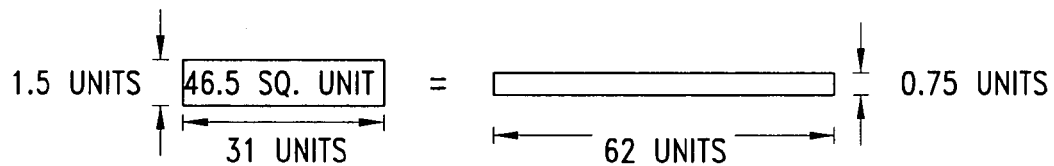
Figure 4C:
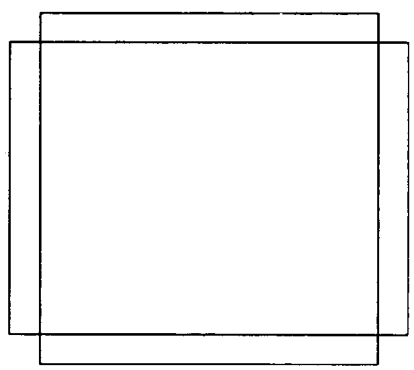

As illustrated in FIG. 4B, the area of the remainder piece is then divided into 4 pieces, leaving individual pieces of area 186/4=46.5 square units. If the area of this individual piece is then divided by the side of the perfect square (62), the result is 0.75. Therefore, a piece of 1.5×62 will have the same area as ¼ of the remaining area.

The length (62 units) of one side of this new piece is now the same as the length of a side of the perfect square. If, as illustrated in FIG. 4C, an individual piece is added evenly on each side of the square, a new square will result that has the same area (4030) as the original rectangle. To keep the area the same, the area of the individual piece is divided by the side of the square (62). Thus, the extra side increases on one side of the square will be given by:

Small rectangle area/area of side of perfect square=46.5/62=0.75

Since there will be two sides, the new side=2*0.75+62=63.5

Therefore, the approximate square root is 63.5, which is accurate to 0.03% of the actual square root of 4030. Thus, the algorithm for finding the square root of a VALUE can be thus summarized as follows:

1. Find the approximate square (use a look-up table, a binary search method, or some other method);

2. Deduct the approximate square from VALUE to get a remainder;

3. Divide the remainder by the approximate square root value (from the look-table) to get a correction factor; and 4. Add half the correction factor to the approximate square root value to obtain the approximate result of the square root operation.

In the above algorithm, the divide-by-4 and multiply-by-2 operations have been combined into a single divide-by-2 operation to save some computational operations and time. Based on this algorithm, the approximate square root for 4030 is obtained according to the following:

$$4030-62*62=186$$

Approximate square root=62+186/62/2=63.5

This approximate square root provides an error of 0.028%. At least some of the source of this error is due to the assumption that when the four sidebars were added (see FIG. 4C), a perfect square is obtained, which is not true. As can be seen in FIG. 4C, there are 4 small squares at each corner that need to be deducted from the total area in order to obtain a more accurate result. In some embodiments of the present techniques, the method may be used without accounting for the 4 small squares and will still provide a sufficiently accurate result. In other implementations, the method may include an accounting for the missing squares and will provide a result that is greater in accuracy.

An exemplary embodiment of such a method is as follows. Since there are 4 small squares, each small square is divided by the side (62), and the resulting value is deducted from the 63.5 result obtained above. That is, 2*0.75*0.75/62 is deducted:

63.5−2*0.75*0.75/62=63.4818, which is accurate within 0.00054%.

Accordingly, an algebraic formulation for one embodiment of a square root finding algorithm according to the present techniques is derived below:

Assume the squared number (VALUE) is Y;

Find the number X whose square is close to Y, by using a look-up table, a square and compare technique, a binary search technique, or some other technique.

Find the remainder R=Y−X*X;

From the above, the approximate square root (SR) of Y will be given by:

SR1=X+2*R/X/4, which provides the first level of approximation as described above, with a certain level of minor error; and For increased accuracy, the following equation can be used:

$$SR2=X+2*R/X/4-2*R/X/4*R/X/4/X$$

The ⅔ quantity can be simplified to ½ (i.e., a divide-by-2 operation or a multiply by 0.5 operation). The added operations (i.e., the adjustment value of 2*R/X/4*R/X/4/X) to obtain increased accuracy in equation SR2 involves, when compared to equation SR1, one extra multiplication, one extra division, and then one extra subtraction. The term R/X/4 was already computed in equation SR1, and therefore can be used in equation SR2 directly.

As described above, varying degrees of accuracy for a square root result can be obtained simply using a look-up table; equation SR1; or equation SR2. The resolution of a look-up table and its effect on the accuracy of an RMS calculation becomes relevant when RMS values of currents need to be determined. For voltages, the variation is generally between 50% to 150% of a nominal value, for instance. The nominal value is much larger (120V to 277V). However, this is not true for currents. Currents can vary from a few amps to a few hundred amps. Therefore, use of a look-up table alone cannot guarantee a good result in some situations.

Figure 5:
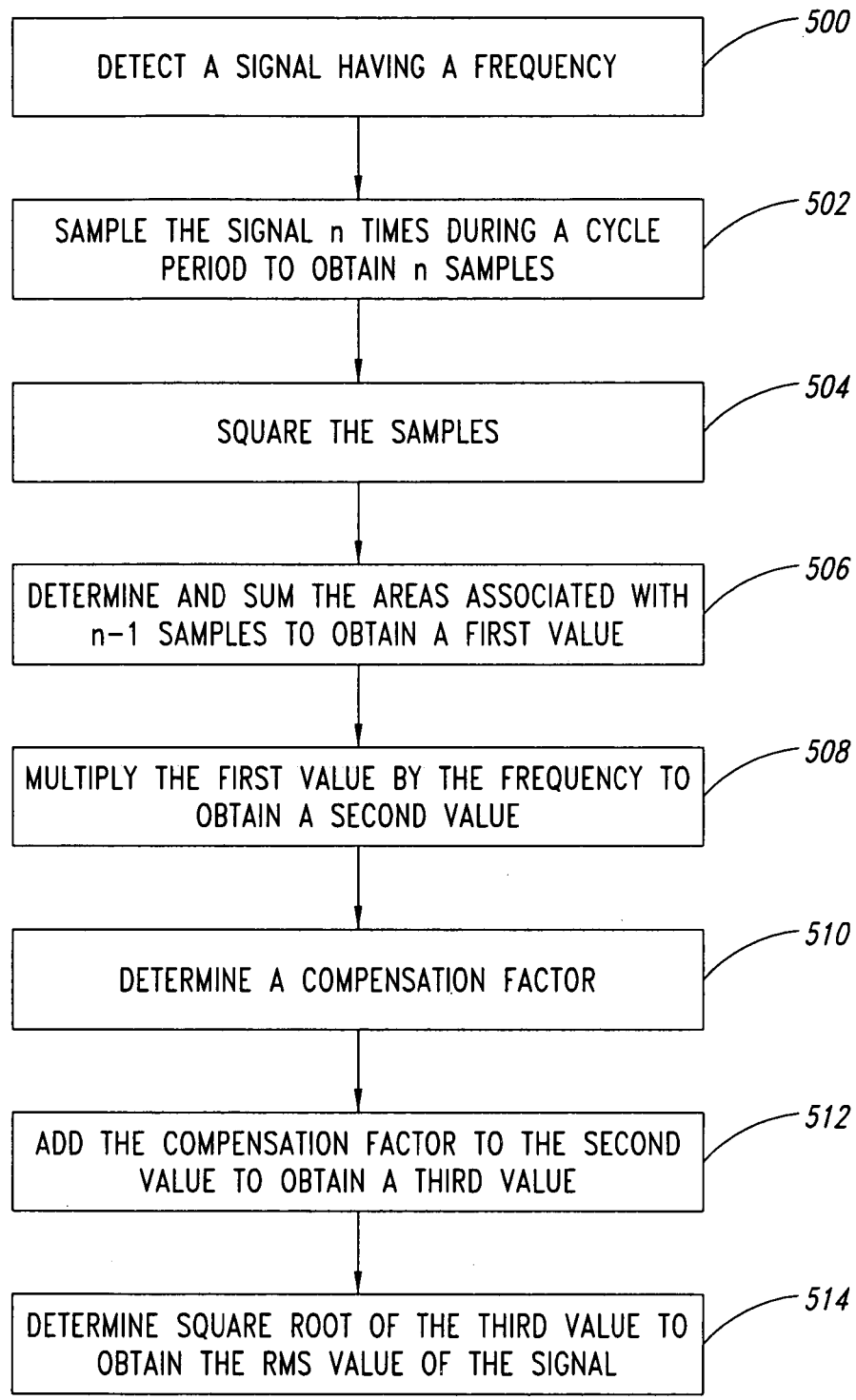
FIG. 5 is a flowchart illustrating a technique for determining a RMS in accordance with an embodiment of the present techniques.

FIG. 5 is a flowchart illustrating one embodiment of an RMS determination technique that allows RMS determinations to be performed accurately for a very wide range of values. At least some elements of the flowchart may be implemented as machine-readable instructions stored on a machine-readable medium, such as software or firmware in storage medium 116 that can be executed by controller 118. Moreover, it will be appreciated by those skilled in the art that certain elements of the flowchart need not necessarily occur in the exact order shown, and that certain elements can be suitably added, omitted, or combined, alternatively or in addition to what is explicitly illustrated.

Beginning at block 500, the controller 118 detects a signal (voltage or current) having a certain frequency from the power grid 108. At block 502, the controller 118 acquires n samples at a sampling rate of 1/Ts. At block 504, the samples are squared. At block 506, the controller 118 determines the areas associated with n−1 samples and sums the areas to obtain a first value in accordance with equation RMS2. At block 508, the controller 118 multiplies the first value by the power grid frequency to obtain a second value. At block 510, the controller 118 determines the compensation factor of equation RMS2.

At block 512, the controller 118 determines a third value that corresponds to the second value plus the compensation factor, in accordance with equation RMS2.

At block 514, the controller 118 determines the square root of the third value which represents the RMS value of the signal.

Figure 6:
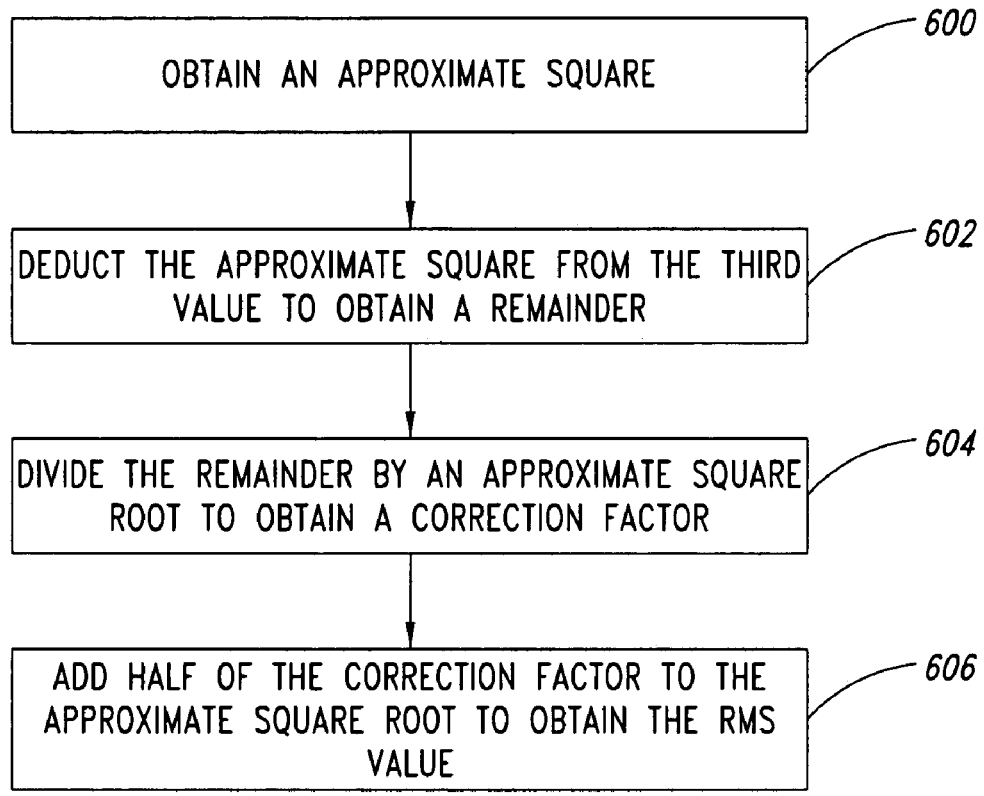
FIG. 6 is a flowchart illustrating a first example technique for determining a square root.

FIG. 6 is a flow chart illustrating the first square root approximation technique described above, and which may be utilized in block 514 of FIG. 5. For example, at block 600 the controller 118 determines an approximate square, for example, from a look-up table or other data source. At block 602, the controller 118 deducts the approximate square from the third value to obtain a remainder. At block 604, the controller 118 divides the remainder by the approximate square root value to obtain a correction factor. At block 606, the controller 118 adds half of the correction factor to the approximate square root value to obtain the desired RMS value.

Figure 7:
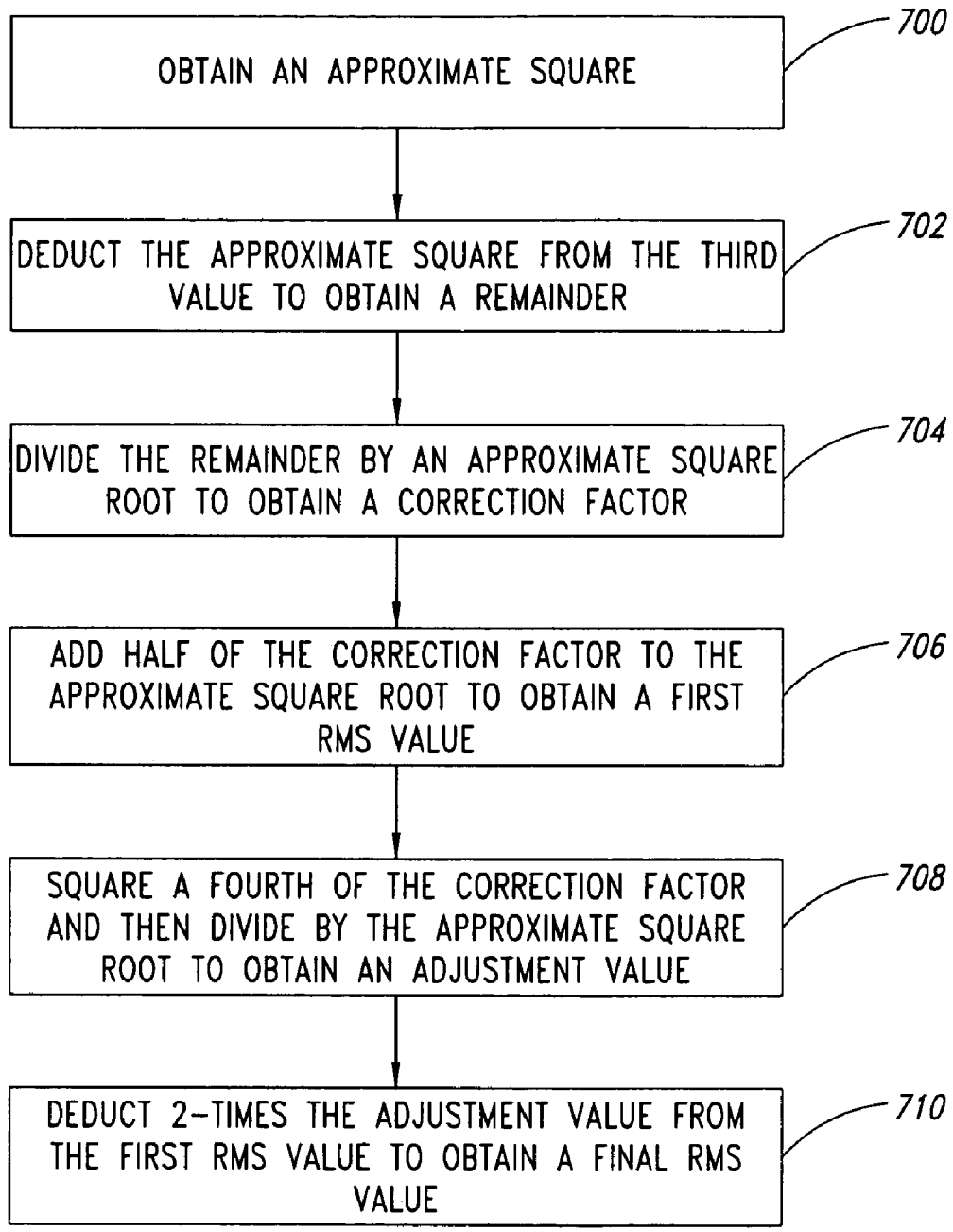
FIG. 7 is a flowchart illustrating a second example technique for determining a square root.

FIG. 7 is a flow chart illustrating the second square root approximation technique described above, and which may also be utilized in block 514 of FIG. 5. For example, at block 700 the controller 118 determines the approximate square, for example, from a look-up table or other data source. At block 702, the controller 118 deducts the approximate square from the third value to get a remainder. At block 704, the controller 118 divides the remainder by the approximate square root value to get a correction factor. At block 706, the controller 118 adds half of the correction factor to the approximate square root value to obtain a first RMS value. At block 708, the controller 118 squares a fourth of the correction factor and divides by the approximate square root value to obtain an adjustment value. At block 710, the controller 118 deducts two-times the adjustment value from the first RMS value to obtain a value representative of a final RMS value.

All of the above U.S. patents, U.S. patent application publications, U.S. patent applications, foreign patents, foreign patent applications and non-patent publications referred to in this specification and/or listed in the Application Data Sheet, including but not limited to U.S. Provisional Application No. 60/469,073', filed May 7, 2003, and entitled "METHOD FOR CALCULATING RMS VALUES FOR GRID-LINK INVERTERS," and U.S. Provisional Application No. 60/470,543, filed May 9, 2003, and entitled "METHOD FOR CALCULATING RMS VALUES FOR GRID-LINK INVERTERS," are incorporated herein by reference, in their entirety.

The above description of illustrated embodiments of the present techniques, including what is described in the Abstract, is not intended to be exhaustive or to limit the invention to the precise forms disclosed. While specific embodiments of, and examples for, the present techniques are described herein for illustrative purposes, various equivalent modifications are possible within the scope of the invention and can be made without deviating from the spirit and scope of the invention.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. A method of determining a root mean square (RMS) of a signal for controlling operation of a converter, the method comprising:
   squaring the signal;
   sampling the squared signal n times during a cycle period to obtain n samples;
   summing the first n–1 samples to obtain a first value;
   multiplying the first value by a sampling time and a frequency of the signal to obtain a second value;
   determining a compensation factor;
   adding the compensation factor to the second value to obtain a third value; and
   determining a square root of the third value to obtain a RMS result.

2. The method of claim 1 wherein determining a compensation factor comprise s using an nth sample.

3. The method of claim 1 wherein determining a compensation factor comprises using the frequency of the signal.

4. The method of claim 1 wherein determining a square root of the third value comprises obtaining an approximate result by:
   obtaining an approximate square;
   deducting the approximate square from the third value to obtain a remainder;
   dividing the remainder by an approximate square root to get a correction factor; and
   adding half of the correction factor to the approximate square root to obtain a first RMS result.

5. The method of claim 4 wherein obtaining an approximate square comprises using a look-up table.

6. The method of claim 4 wherein obtaining an approximate square comprises performing a binary search.

7. The method of claim 4, further comprising:
   squaring a fourth of the correction factor and dividing by the approximate square root to obtain an adjustment value; and
   deducting two-times the adjustment value from the first RMS result to obtain a second RMS result.

8. The method of claim 1, further comprising:
   monitoring the RMS result to detect an abnormal condition in a power grid.

9. The method of claim 8, further comprising:
   disconnecting the converter from the power grid if the RMS result is indicative of an abnormal condition in the power grid.

10. The method of claim 1 wherein the converter is a DC-to-AC inverter.

11. A processor-readable medium storing instructions for causing a processor to determine a root mean square (RMS) of a signal by:
    sampling the signal n times during a cycle period to obtain n samples;
    squaring the first n–1 samples to obtain n–1 squared samples;
    summing the n–1 squared samples to obtain a first value;
    multiplying the first value by a sampling time and a frequency of the signal to obtain a second value;
    determining a compensation factor;
    adding the compensation factor to the second value to obtain a third value; and
    determining a square root of the third value to obtain a RMS result.

12. The processor-readable medium of claim 11 wherein determining a compensation factor comprises using an nth sample.

13. The processor-readable medium of claim 11 wherein determining a compensation factor comprises using the frequency of the signal.

14. The processor-readable medium of claim 11 wherein determining a square root of the third value comprises obtaining an approximate result by:
    obtaining an approximate square;
    deducting the approximate square from the third value to obtain a remainder;
    dividing the remainder by an approximate square root to get a correction factor; and
    adding half of the correction factor to the approximate square root to obtain a first RMS result.

15. The processor-readable medium of claim 14 wherein obtaining an approximate square comprises using a look-up table.

16. The processor-readable medium of claim 14 wherein obtaining an approximate square comprises performing a binary search.

17. The processor-readable medium of claim 14, further comprising:
    squaring a fourth of the correction factor and dividing by the approximate square root to obtain an adjustment value; and
    deducting two-times the adjustment value from the first RMS result to obtain a second RMS result.

18. The processor-readable medium of claim 10, further comprising:
    monitoring the RMS result to detect an abnormal condition in a power grid.

19. The processor-readable medium of claim 18, further comprising:
    disconnecting a converter from the power grid if the RMS result is indicative of an abnormal condition in the power grid.

20. The processor-readable medium of claim 19 wherein the converter is a DC-to-AC inverter.

21. An electric power system to transform power between a power grid and a power source, the electric power system comprising:
    a converter;
    at least one switch selectively operable to electrically couple the converter to the power grid in a first state and to electrically uncouple the converter from the power grid in a second state; and a controller coupled to control the converter and the at least one switch, the controller configured to determine a root mean square (RMS) of a signal associated with the power grid by:

squaring the signal;

sampling the squared signal n times during a cycle period to obtain n samples;

summing the first n−1 samples to obtain a first value;

multiplying the first value by a sampling time and a frequency of the signal to obtain a second value;

determining a compensation factor;

adding the compensation factor to the second value to obtain a third value; and determining a square root of the third value to obtain a RMS result.

22. The electric power system of claim 21 wherein determining a compensation factor comprises using an nth sample.

23. The electric power system of claim 21 wherein determining a compensation factor comprises using the frequency of the signal.

24. The electric power system of claim 21 wherein determining a square root of the third value comprises obtaining an approximate result by:

obtaining an approximate square;

deducting the approximate square from the third value to obtain a remainder;

dividing the remainder by an approximate square root to get a correction factor; and adding half of the correction factor to the approximate square root to obtain a first RMS result.

25. The electric power system of claim 24 wherein obtaining an approximate square comprises using a look-up table.

26. The electric power system of claim 24 wherein obtaining an approximate square comprises performing a binary search.

27. The electric power system of claim 24, further comprising:

squaring a fourth of the correction factor and dividing by the approximate square root to obtain an adjustment value; and deducting two-times the adjustment value from the first RMS result to obtain a second RMS result.

28. The electric power system of claim 21, further comprising:

monitoring the RMS result to detect an abnormal condition in the power grid.

29. The electric power system of claim 28, further comprising:

disconnecting the converter from the power gird if the RMS result is indicative of an abnormal condition in the power grid.

30. The electric power system of claim 21 wherein the converter is a DC-to-AC inverter.

* * * * *